United States Patent

[11] 3,569,800

[72] Inventor Thomas W. Collins
San Jose, Calif.
[21] Appl. No. 757,440
[22] Filed Sept. 4, 1968
[45] Patented Mar. 9, 1971
[73] Assignee International Business Machines Corporation
Armonk, N.Y.

[54] RESISTIVELY ISOLATED INTEGRATED CURRENT SWITCH
10 Claims, 4 Drawing Figs.

[52] U.S. Cl. .......... 317/235, 317/234, 148/176
[51] Int. Cl. .......... H01l 19/00
[50] Field of Search .......... 317/235; 22.11; 317/235/22.1, 235/22

[56] References Cited
UNITED STATES PATENTS

| | | | |
|---|---|---|---|
| 3,260,902 | 7/1966 | Porter | 317/235 |
| 3,341,755 | 9/1967 | Husher | 317/235 |
| 3,380,153 | 4/1968 | Husher | 29/577 |

*Primary Examiner*—John W. Huckert
*Assistant Examiner*—Martin H. Edlow
*Attorney*—Fraser and Bogucki

ABSTRACT: An integrated circuit is provided in which highly conductive collector current paths within the transistors of a logical current switch are formed by heavily doped buried layers extending into contact with a common base and heavily doped collector plugs extending between the buried layers and the various collector contacts. A lightly doped epitaxial layer surrounds the collector plugs and buried layers to resistively isolate the current switch from external circuit elements and to resistively isolate the collector current paths from one another. The current from the common emitter is crowded through the common base and into selected ones of the collector current paths in accordance with the relative voltages applied to distinct regions of the base electrically separated from one another by a relatively thin central region thereof.

INVENTOR
THOMAS W. COLLINS

BY Fraser and Bogucki

ATTORNEYS

INVENTOR
THOMAS W. COLLINS
BY *Fraser and Bogucki*
ATTORNEYS

RESISTIVELY ISOLATED INTEGRATED CURRENT SWITCH

BACKGROUND OF THE INVENTION

1. Field of the Invention

The present invention relates to semiconductor devices, and more particularly to integrated circuits such as current switches designed to operates within a limited amount of physical space.

2. Description of the Prior Art

The increasing complexity of computer and other electronic systems coupled with a strong emphasis on miniaturization has dictated the use of circuit components or arrangements which occupy a limited amount of physical space within the system, yet perform the necessary electronic functions. One solution to the problem has been the use of integrated circuit techniques in which a plurality of circuits may be fabricated from a single crystal of semiconductor material using diffusion or other well-known processes. The resulting integrated circuit provides an integral unit of considerable simplicity and relatively small size, which unit may be readily incorporated in a larger system and removed if maintenance or repair are required.

Circuits fabricated from the same crystal must be electrically isolated from each other. Presently known integrated circuits suffer from a number of disadvantages, particularly in view of ever increasing demands for miniaturization because of the means used to electrically isolate circuits on the same chip. Electrical isolation has been accomplished in a number of ways including the reverse biasing of a PN junction which surrounds each device to be isolated. Such techniques, however, involve numerous disadvantages including undesirable capacitance at the isolation wide walls and decreased packing density in the form of fewer isolated components or circuits within an integrated circuit of given size. Conventional isolation techniques are particularly wasteful of space where a component or circuit comprising a plurality of interrelated elements is used. In a logical current switch, for example, the emitters of four different transistors are common to one another, and could be formed by a single diffusion, for example, were it not for the requirement that the transistor bases be isolated from one another and that the collector of one of the transistors be isolated from the other three. Because of this requirement the transistors must be fabricated as four separate units, each having its own emitter, base and collector, and one of the units being located within an island resistively isolated from the others.

BRIEF SUMMARY OF THE INVENTION

The present invention provides an integrated circuit having a device or component comprised of emitter, base and collector elements disposed in emitter-base junction and collector-base junction forming relation. The collector element includes a plurality of heavily doped regions defining highly conductive collector current paths and a lightly doped region which surrounds the heavily doped current path regions of the collector element as well as the base and emitter elements to resistively isolate the collector current paths from one another and to resistively isolate the base and emitter elements as well as the collector current paths from other devices or components which may be included in the integrated circuit. The presence of the lightly doped region within the collector element eliminates the need for conventional isolation techniques such as reverse biased PN junction which present undesirable sidewall capacitances and which reduce the available packing density in view of the considerable space consumed thereby.

In accordance with particular aspects of the invention, each of the heavily doped collector current path defining regions of the collector element may comprise a heavily doped buried layer which extends into contact with the base element and a heavily doped collector plug which extends from a surface portion of the collector element into contact with the buried layer to complete the current path. The lightly doped region of the collector element may comprise a relatively thin epitaxial layer of very lightly doped material. Current within the collector element of the device is constrained to flow along one or more of the highly conductive paths defined by the buried layers and collector plugs, and leakage current through the lightly doped epitaxial layer is negligible.

The resistive isolation of the collector current paths provided by the lightly doped region of the collector element facilitates the fabrication of a plurality of commonly coupled circuit elements such as the transistors of a logical current switch as a single device within the integrated circuit. In a preferred embodiment of a four-transistor logical current switch, a pair of buried layers formed at the interface between a thin epitaxial layer and a substrate and associated diffused collector plugs extending between the buried layers and different portions of the upper surface of the expitaxial layer define highly conductive in-phase or reference and out-of-phase current paths. The lightly doped epitaxial layer isolates the device and the collector current paths therein. The current within a heavily doped common emitter element is crowded through the relatively thin central region of a lightly doped common base element to one or the other of the collector current paths in accordance with the relative voltages applied to distinct outer regions of the base element. The thin central region of the base element resistively isolates the distinct outer regions from one another.

BRIEF DESCRIPTION OF THE DRAWINGS

The foregoing and other objects, features and advantages of the present invention will be apparent from the following more particular description of the invention, as illustrated with the accompanying drawings, in which.

DETAILED DESCRIPTION

Figure 1:
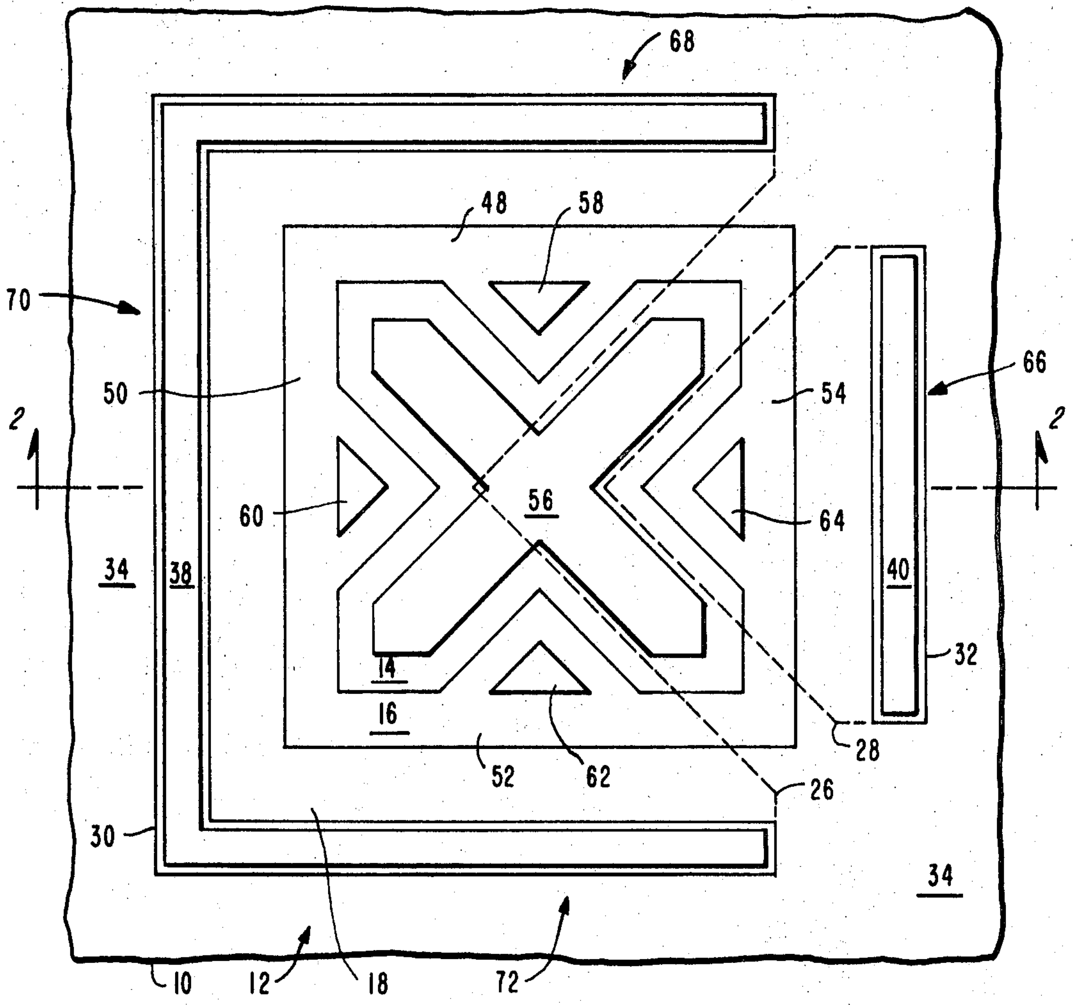
FIG. 1 is a top view of a component portion of an integrated circuit in accordance with the invention including emitter, base and collector elements.
Figure 2:
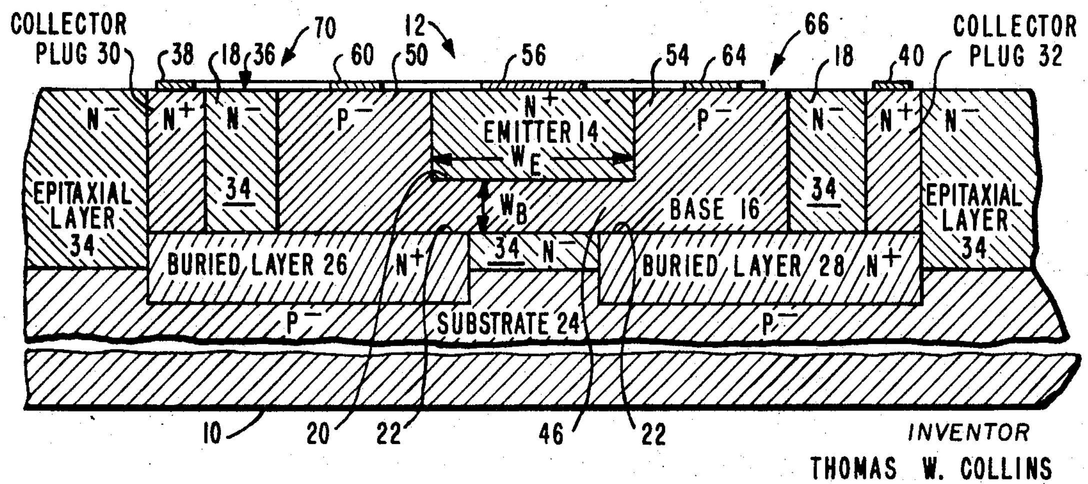
FIG. 2 is a vertical profile of the integrated circuit portion of FIG. 1 taken along the line 2–2 thereof.

The present invention is conveniently described in connection with a particular arrangement of a logical current switch shown in FIG. 1 and 2 and in schematic form in FIG. 4, although it will be understood that the general principles thereof apply to current switches other than that illustrated and to other types of integrated circuit components as well. The arrangement shown in FIG. 1 and 2 is an integrated circuit 10, preferably of monolithic form, comprising a plurality of circuit components including a particular component portion 12, in this instance a logical current switch. The component portion 12 includes emitter, base an collector elements 14, 16 and 18 disposed in emitter-base junction 20 and collector-base junction 22 forming relation. A substrate element 24 of relatively lightly doped material conveniently illustrated as being of P-type semiconductivity extends throughout the integrated circuit 10 forming a support member therefor.

The collector element 18 includes a plurality of relatively heavily or degenerately doped regions 26, 28, 30 and 32 defining highly conductive collector current paths and a relatively lightly or intrinsically doped region 34 which surrounds the heavily doped current path regions 26, 28, 30 and 32 of the collector element 18 as well as the emitter and base elements 14, 16. In the particular current switch illustrated in FIG. 2, the current paths are two in number and comprise buried layers 26, 28 of relatively heavily doped material of N-type semiconductivity extending into contact with the base element 16 to form a portion of the collector-base junction 22 and collector plugs 30 and 32 of relatively heavily doped material of N-type semiconductivity extending from an upper surface 36 of the lightly doped region 34 into contact with respective ones of the buried layers 26, 28. A pair of ohmic collector contacts 38 and 40 are respectively mounted on the collector plugs 30 and 32 at the upper surface 36 to facilitate the external connection of the current switch 12. The lightly doped region 34 comprises a layer of relatively lightly doped material of N-type semiconductivity epitaxially grown upon the substrate element 24 and extending throughout the integrated circuit 10 so as to form the upper portion thereof. The buried layers 26, 28 and the collector plugs 30, and 32 may be fabricated by an appropriate process such as diffusion, the buried layers being partially inset within the substrate element 24 from the upper surface thereof.

The lightly doped collector region 34 resistively isolates the collector current paths from one another and resistively isolates the emitter and base elements 14, 16 as well as the collector current paths from other components (not shown) which may be included in the integrated circuit 10. Collector current is constrained to flow within the heavily doped buried layers 26, 28 and collector plugs 30, 32 and leakage currents through the lightly doped region or epitaxial layer 34 are negligible.

The lightly doped region or epitaxial layer 34 eliminates problems with respect to sidewall capacitance frequently present when conventional isolation techniques such as reverse biased PN junctions are employed. The elimination of space consuming devices such as the reverse biased PN junction moreover improves packing density by enabling a greater number of elements or components such as the current switch 12 to be formed within a monolithic arrangement of given size. In the arrangement shown in FIG. 1 and 2 the epitaxial layer 34 extends over substantially the entire integrated circuit 10 forming parts of the collector elements of other components as well as the component portion or current switch 12. Adjacent components may be located immediately outside of the switch 12, the actual proximity thereto being determined in part by the level of doping of the epitaxial layer 34 and the resulting leakage currents which although very small may nevertheless be present therein.

The use of the lightly doped region or epitaxial layer 34 in combination with the conductive collector current paths as defined by the buried layers 26, 28 and collector plugs 30, 32 moreover, provides for a considerable reduction in the size of the circuit components themselves in some instance. This is particularly true in the case of components such as the current switch 12 having a plurality of elements with one or more common interconnections.

Accordingly, the commonly coupled emitters of four transistors which are defined by the current switch 12 comprise a single emitter element 14 as shown in FIG. 1 and 2, which element is comprised of relatively heavily or degenerately doped material of N-type semiconductivity. By making use of current crowding techniques the bases of the transistors are fabricated of a single base element 16 of relatively lightly or intrinsically doped material of P-type seimconductivity, which element comprises a relatively thin central region 46 disposed immediately under the emitter element 14 and adjacent the buried layers 26, 28 and four distinct outer portions or regions 48, 50, 52, and 54 substantially symmetrically disposed about the outer periphery of the central region 46. An ohmic emitter contact 56 is mounted on the emitter element 14 and four ohmic base contacts 58, 60, 62 and 64 are respectively mounted on the outer regions 48, 50, 52 and 54 of the base element 16. Each of the outer regions 48, 50, 52 and 54 in combination with the central region 46 defines the base region of a different one of the four transistors within the current switch 12. The emitter and base elements 14, 16 may be fabricated by any appropriate technique such as diffusion, the base element 16 being inset within the epitaxial layer 34 from the upper surface 36 thereof and extending into contact with the buried layers 26, 28 and the emitter element 14 being inset into the base element 16 from the upper surface thereof so as to define the thin central region 46 and the outer regions 48, 50, 52 and 54.

One of the transistors 66 of the current switch 12 functions as a reference transistor and is defined by the common emitter element 14 and contact 56, the base outer region 54 and associated contact 64, and the buried layer 28, collector plug 32 and associated contact 40. The remaining three transistors 68, 70 and 72 which function as input transistors for the current switch 12 share the common emitter element 14 with the reference transistor 66 and have bases which respectively include the base outer region 48 and associated contact 58, the outer region 50 and associated contact 60, and the outer region 52 and associated contact 62. The thin central region 46 is common to and forms a part of the base of each of the four transistors 66, 68, 70 and 72. The collectors of the input transistors 68, 70 and 72 which are common to one another but not to that of the reference transistor 66 are formed by the buried layer 26, the collector plug 30 and the associated contact 38. The input transistors 68, 70 and 72 accordingly share one of the highly conductive collector current paths, the other collector current path being used by the reference transistor 66.

In operation, current within the heavily doped common emitter element 14 is crowded through the relatively thin central region 46 of the base element 16 to one or the other of the collector current paths in accordance with the relative voltages applied to the various base contacts 58, 60, 62 and 64. The base contacts 58, 60, 62 and 64 and associated outer regions 48, 50, 52 and 54 are resistively isolated from one another by the lightly doped thin central region 46 enabling the establishment of different voltages at the different base contacts without interference. Conditions which increase the tendency for current crowding to occur include light base doping, low $\beta$ or current gain of the common emitter, narrow base width $W_B$, large emitter width $W_E$ and large current density J which is equal to the current divided by the emitter area. In the present example, the base material is lightly doped causing the base to have relatively high resistance. The transistors formed from the component 12 have low $\beta$. As illustrated in FIG. 2, the base width $W_B$, which is the thickness of the base element 16 extending between the emitter element 14 and the buried layers 26, 28, is relatively small and is generally represented by the thickness of the relatively thin central base region 46. The emitter width $W_E$, which is the generally horizontal dimension of the emitter element 14 as shown in FIG. 2, is relatively great in comparison to the base width $W_B$. The current density J is made relatively high for the given emitter area by operating at relatively high operating currents.

Figure 3:
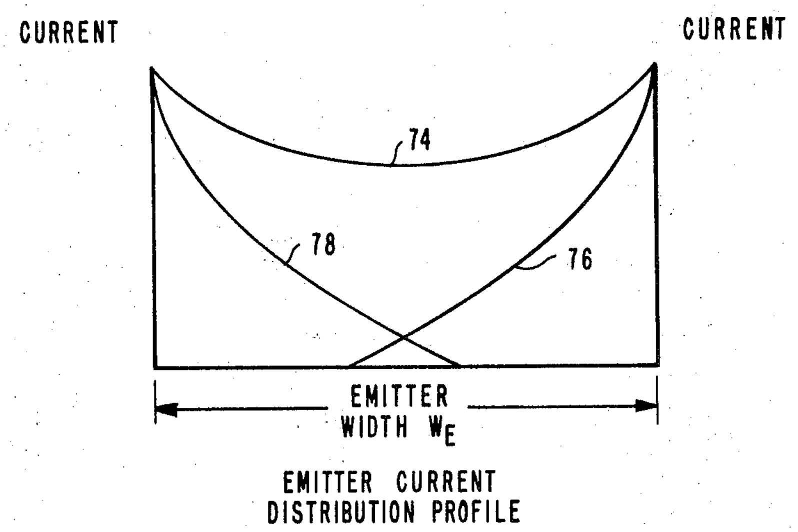
FIG. 3 is a simplified graphical illustration of current distribution within the emitter element of the integrated circuit portion of FIG. 1 as a function of different input conditions.

The resulting distribution of current within the emitter element 14 for different relatives values of voltage at the base contacts 64 and 60 of the reference and input transistors 66 and 70, for example, is shown in FIG. 3, which illustration shows the emitter width $W_E$ taken generally along the line 2–2 of FIG. 1 as in FIG. 2. As shown by the curve 74 in FIG. 3 the emitter current is substantially evenly distributed between the base outer regions 54 and 50 and associated buried layers 28 and 26 whenever the voltages at the respective base contacts 64 and 60 are substantially equal, and both transistors 66 an 70 conduct. If the voltage at the base contact 64 is substantially more positive than that of the base contact 60, current crowds to the emitter edge closest the base contact 64 and associated outer region 54 as depicted by the curve 76 in FIG. 3. The reference transistor 66 accordingly conducts while the input transistor 70 does not. If the opposite condition occurs and the base contact 60 has a voltage more positive than that of the base contact 64, the input transistor 70 conducts and the reference transistor 66 is cut off, the emitter current crowding to the edge thereof closest the base contact 60 and associated outer region 50 as shown by the curve 78 in FIG. 3. The current flow concentrations across the emitter element 14 are also a function of the relative voltages at the base contacts 58 and 62 of the input transistors 68 and 72, and the emitter current may crowd the edges closest either or both of such transistors causing them to conduct whenever the associated base voltages are of appropriate value.

The reference transistor 66 will therefore conduct causing substantially all of the emitter current to flow through the associated collector current path as defined by the buried layer 28 and collector plug 32 and the input transistors 68, 70 and 72 are cut off, whenever the voltage at the base terminal 64 is more positive than the voltage at each of the base terminals 58, 60 and 62. When the voltage at any one or more of the base terminals 58, 60 and 62 becomes more positive than the voltage at the base terminal 64 however, the associated input transistors conduct substantially all of the emitter current through the associated collector current path as defined by the buried layer 26 and collector plug 30, and the reference transistor 66 is cut off.

Figure 4:
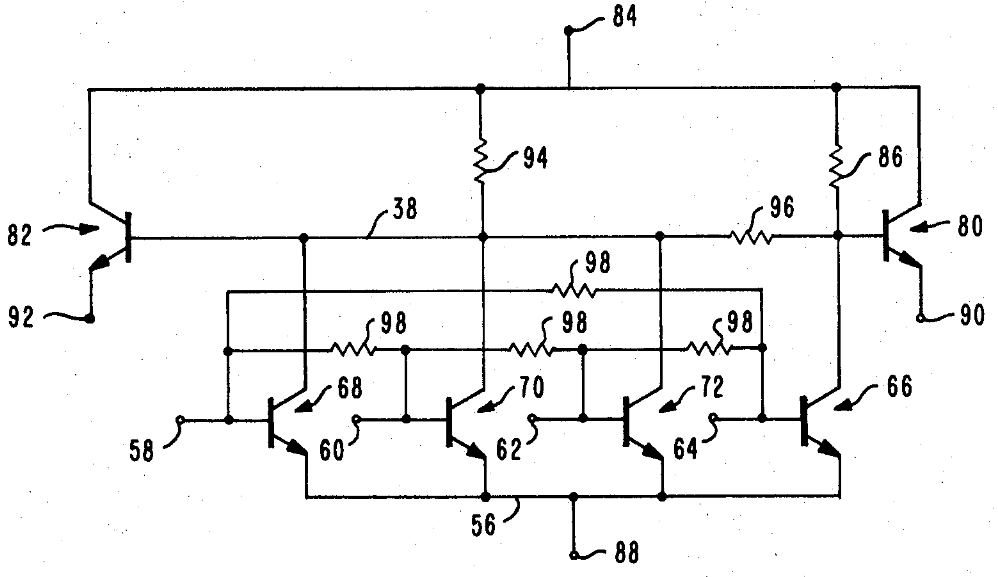
FIG. 4 is a schematic diagram of the logical current switch provided by the integrated circuit portion of FIG. 1.

The function of the current switch 12 of FIG. 1 and 2 may be better understood with reference to FIG. 4 which is a schematic illustration of the switch 12 combined with a pair of transistors 80 and 82 coupled in emitter follower fashion. The base terminal or contact 64 of the reference transistor 66 is maintained at a constant reference voltage which is 72 positive than the voltage at many of the base terminals 58, 60 and 62 of the input transistors 68, 70 and 72 in the absence of input signals thereto. Current flows from the positive terminal 84 of a power supply through a resistance 86 and the reference transistor 66 to the negative terminal 88 of the power supply. The associated emitter follower transistor 80 is biased into nonconduction, the resulting low voltage at the emitter terminal 90 thereof indicating an OR or "in-phase" function. The input transistors 68, 70 and 72 are cut off biasing the associated emitter follower transistor 82 into conduction, and the resulting high voltage at the emitter terminal 92 thereof indicates the absence of a NOR or "out-of-phase" function.

When any one or more of the input transistors 68, 70 and 72 receives an input signal in the form of a base voltage which is more positive in value than the reference voltage applied at the terminal 64 of the reference transistor 66, those of the transistors 68, 70 and 72 which are so biased conduct current between the positive and negative terminals 84 and 88 of the power supply via a resistance 94. The associated emitter follower transistor 82 is cut off, and the resulting voltage of low value at the emitter terminal 92 thereof indicates the presence of a NOR or "out-of-phase" function. At the same time the reference transistor 66 is cut off rendering the associated emitter follower transistor 80 conductive and providing a signal at the emitter terminal 90 thereof to indicate the absence of an OR or "in-phase" function.

The collector of the reference transistor 66 is isolated from the collectors of the input transistors 68, 70 and 72 by that portion of the epitaxial layer 34 extending between the buried layers 26 and 28 which is represented by resistance 96 and is typically on the order of 10 K ohms or greater. Resistances 98 shown as extending between the various base terminals in FIG. 4 represent the lightly doped, thin central region 46 of the base element and are typically on the order of about 5 K ohms.

The emitter follower transistors 80 and 82 and the resistances 86 and 94 may be formed as a part of the current switch 12 if desired. Such an arrangement is formed by separate combinations of buried layers, base elements and emitter elements formed within the epitaxial layer 34 during the fabrication of the current switch 12. The buried layers are caused to extend into contact with a single collector plug, the associated contact of which is coupled to the positive terminal 84 of the power supply. Those portions of the epitaxial layer 34 and the medium doped buried layers which extend between the base elements and the single collector plug define the resistances 86 and 94 and are chosen to have values on the order of 100 to 200 ohms. Each of the emitter elements is provided with a contact to form the output terminals 90 and 92, and the collector contacts 38 and 40 of the arrangement shown in FIG. 1 and 2 are extended over different ones of the base elements to form the base contacts therefor.

It has been found that an epitaxial layer 34 having a thickness of approximately 1.5 micrometers or less and a resistivity of 5 ohm centimeters or greater provides ample resistive isolation of the current switch 12 and of the collector current paths therein. The collector current paths may be provided with suitable conductivity by buried layers having a sheet resistance on the order of 15 ohms per square or less and collector plugs having a resistivity of 0.01 ohm centimeters or less. Good current crowding and resistive isolation of the base outer regions 48, 50, 52 and 54 may be provided by a base element 16 having a sheet resistance on the order of 1000 ohms per square or greater and a sheet resistance directly under the emitter on the order of 25 K ohms per square or greater.

The arrangement illustrated in FIGS. 1 and 2 provides a convenient and simplified example of a particular current switch. The overall size and capacitive effects of such arrangement may be reduced however, if desired, by employing three individual collector plugs and associated contacts instead of the single, generally U-shaped plug 30 and contact 38 as shown in FIG. 1 for the three input transistors 68, 70 and 72. Moreover, in the event the input transistors 68, 70 and 72 are to be provided with independent collector current paths to provide a slightly different component arrangement, the single buried layer 26 may be replaced by separate buried layers, each extending into contact with a different collector plug and associated contact. In such an arrangement the portions of the epitaxial layer 34 which lie between the separate buried layers and associated collector plugs provide the necessary isolation of the resulting collector current paths.

The attendant reduction in size of integrated circuits in accordance with the invention can be appreciated by comparing the particular arrangement of the current switch 12 shown in FIGS. 1 and 2 with a typical conventional arrangement of such switch in integrated circuit form. In the typical conventional arrangement the current switch must be isolated from other components within the integrated circuit by a surrounding reverse biased PN junction or other appropriate means. The switch itself within such boundary must be divided into three distinct isolation regions, one of which includes the reference transistor 66, a second of which includes the input transistors 58, 60 and 62, and a third of which includes the emitter follower transistors 80 and 82. Such an arrangement occupies a space which is on the order of 25 square mils or greater. In accordance with the present invention, the overall size of the current switch is initially reduced by elimination of the surrounding isolation means. The three separate isolation regions within the switch normally employed in conventional arrangements are moreover eliminated in accordance with the invention, the lightly doped epitaxial layer 34 and the current crowding effect providing the necessary isolation between the different collector current paths and the relatively thin central region 46 of the base element 16 providing the necessary isolation between the outer base regions 48, 50, 52 and 54. The practical result is an integrated circuit component having an overall size on the order of 4 square mils or less. The addition of the emitter follower transistors 80 and 82 increases this size slightly, but the resulting arrangement is still several times smaller than that of conventional arrangements.

While a particular example of the invention has been described, other examples and modifications will be obvious to those skilled in the art to which this invention pertains. Accordingly, any and all modifications, variations or equivalent arrangements falling within the scope of the annexed claims should be considered to be a part of the invention.

I claim:

1. An integrated circuit comprising a unitary body with a bulk semiconductor material of a first type of semiconductivity forming a substrate region, a plurality of heavily doped regions of a second type of semiconductivity extending into different portions of the substrate region from a surface thereof and forming buried layers, a lightly doped epitaxial layer of material of the second type of semiconductivity extending over said surface of the substrate region and the buried layers, said epitaxial layer having a surface opposite the substrate region which defines the upper surface of the integrated circuit, a plurality of heavily doped regions of the second type of semiconductivity disposed within the epitaxial layer and extending between the upper surface of the integrated circuit and different one of the buried layers to form collector plugs, the expitaxial layer together with the buried layers and the collector plugs forming a collector region, each of the buried layers together with the associated collector plug forming a different collector current path, a base region of material of the first type of semiconductivity extending into the epitaxial layer from the upper surface thereof and having a first portion thereof in contact with each of the buried layers to form a collector-base junction and a plurality of second base portions thereof emanating from the first portion and disposed adjacent different ones of the buried layers, and an emitter region of material of the second type of semiconductivity extending into the base region and forming an emitter-base junction with the first portion of the base region.

2. An integrated circuit in accordance with claim 1, wherein the emitter region is heavily doped and the base region is lightly doped.

3. An integrated current switch comprising an emitter element of semiconductor material of a first conductivity type, an emitter contact mounted on the emitter element, a base element of semiconductor material of a second conductivity type opposite the first conductivity type having a central portion thereof in contact with the emitter element to form an emitter-base junction and four outer portions thereof substantially symmetrically emanating from the central portion, four base contacts mounted on respective ones of the four outer portions of the base element, a collector element of semiconductor material of the first conductivity type having a pair of highly conductive portions thereof, one of which is in contact with the central portion of the base element and three of the four outer portions and the other of which is in contact with the central portion of the base element and the fourth outer portion, and a pair of collector contacts mounted on different ones of the pair of highly conductive portions of the collector element.

4. An integrated current switch in accordance with claim 3, wherein each of the pair of highly conductive portions of the collector element comprises a heavily doped buried layer in contact with the central portion of the base element and a heavily doped column extending between the buried layer and one of the pair of collector contacts, and the collector element includes a substantially nonconductive portion surrounding the buried layers and columns.

5. An integrated circuit comprising a body of semiconductor material having a major surface and including an emitter region of one conductivity type, a base region of opposite conductivity type from the one conductivity type surrounding the emitter region and forming an emitter-base junction therewith, and a collector region of the one conductivity type extending into the semiconductor material from the major surface and surrounding the base region to form a collector-base junction therewith, the collector region being intrinsically doped and including a plurality of degenerately doped portions thereof extending between the base region and separate portions of the major surface to form a plurality of collector current paths, the intrinsically doped collector region resistively isolating the degenerately doped portions from one another and resistively isolating the emitter, base and collector regions within the integrated circuit.

6. An integrated circuit in accordance with claim 5, wherein each of the degenerately doped portions comprises a buried layer disposed in contact with the base region and a column extending from one of the separate portions of the major surface into contact with the buried layer.

7. An integrated circuit in accordance with claim 6, wherein the collector region comprises an intrinsically doped epitaxial layer.

8. An integrated circuit in accordance with claim 6, wherein the base region includes a central portion thereof extending between the emitter and collector regions and a plurality of distinct outer portions extending between the central portion and separate portions of the major surface, each of the distinct outer portions in combination with the central portion defining the base of a separate transistor.

9. An integrated circuit in accordance with claim 8, wherein the emitter region is degenerately doped and the central portion of the base region is intrinsically doped, whereby current within the emitter region is crowded through the central portion of the base region and into a selected one of the degenerately doped portions of the collector region in accordance with the relative values of voltages at the distinct outer portions of the base region.

10. An integrated circuit in accordance with claim 9, further including an emitter contact disposed on the emitter region at the major surface, a plurality of base contacts, each of which is disposed on a different one of the distinct outer portions of the base region at the major surface, and a plurality of collector contacts, each of which is disposed on the column of a different one of the degenerately doped portions at the major surface.